United States Patent

Spanke et al.

(10) Patent No.: US 8,569,881 B2
(45) Date of Patent: Oct. 29, 2013

(54) SEMICONDUCTOR DEVICE

(75) Inventors: Reinhold Spanke, Bestwig (DE); Waleri Brekel, Anroechte (DE); Ivonne Benzler, Bestwig (DE)

(73) Assignee: Infineon Technologies AG, Neubiberg (DE)

( * ) Notice: Subject to any disclaimer, the term of this patent is extended or adjusted under 35 U.S.C. 154(b) by 155 days.

(21) Appl. No.: 12/877,657

(22) Filed: Sep. 8, 2010

(65) Prior Publication Data

US 2012/0056240 A1 Mar. 8, 2012

(51) Int. Cl.
*H01L 23/34* (2006.01)

(52) U.S. Cl.
USPC ........... 257/723; 257/499; 257/500; 257/724; 257/728; 257/E27.001; 257/E27.004; 257/E27.009; 257/E27.064; 257/E25.01; 257/E25.029; 438/107; 438/110; 438/133; 438/134

(58) Field of Classification Search
USPC .......... 257/499, 500, 723, 724, 728, E27.001, 257/E27.004, E27.009, E27.012, E27.014, 257/E27.061, E27.064, E25.001, E25.005, 257/E25.01, E25.011, E25.012, E25.014, 257/E25.015, E25.016, E25.029; 438/107, 438/110, 133, 134
See application file for complete search history.

(56) References Cited

U.S. PATENT DOCUMENTS

2003/0146698 A1* 8/2003 Ohtomo et al. ............... 313/542

* cited by examiner

*Primary Examiner* — Meiya Li
(74) *Attorney, Agent, or Firm* — Dicke, Billig & Czaja, PLLC

(57) ABSTRACT

A semiconductor device includes a baseplate and a first and a second insulated gate bipolar transistor (IGBT) substrate coupled to the baseplate. The semiconductor device includes a first and a second diode substrate coupled to the baseplate and a first, a second, and a third control substrate coupled to the baseplate. Bond wires couple the first and second IGBT substrates to the first control substrate. Bond wires couple the first and second IGBT substrates to the second control substrate via the first and second diode substrates, and bond wires couple the first and second IGBT substrates to the third control substrate via the second diode substrate.

16 Claims, 3 Drawing Sheets

SEMICONDUCTOR DEVICE

BACKGROUND

Power electronic modules are semiconductor packages that are used in power electronic circuits. Power electronic modules are typically used in vehicular and industrial applications, such as in inverters and rectifiers. Typical semiconductor components included within the power electronic modules, such as chopper modules, include insulated gate bipolar transistor (IGBT) semiconductor chips and diode semiconductor chips. The chips are typically electrically coupled together by a printed circuit board. Printed circuit boards, however, add material costs and process costs in the fabrication of power electronic modules.

For these and other reasons, a need exists for the present invention.

SUMMARY

One embodiment provides a semiconductor device. The semiconductor device includes a baseplate and a first and a second insulated gate bipolar transistor (IGBT) substrate coupled to the baseplate. The semiconductor device includes a first and a second diode substrate coupled to the baseplate and a first, a second, and a third control substrate coupled to the baseplate. Bond wires couple the first and second IGBT substrates to the first control substrate. Bond wires couple the first and second IGBT substrates to the second control substrate via the first and second diode substrates, and bond wires couple the first and second IGBT substrates to the third control substrate via the second diode substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

Figure 1:
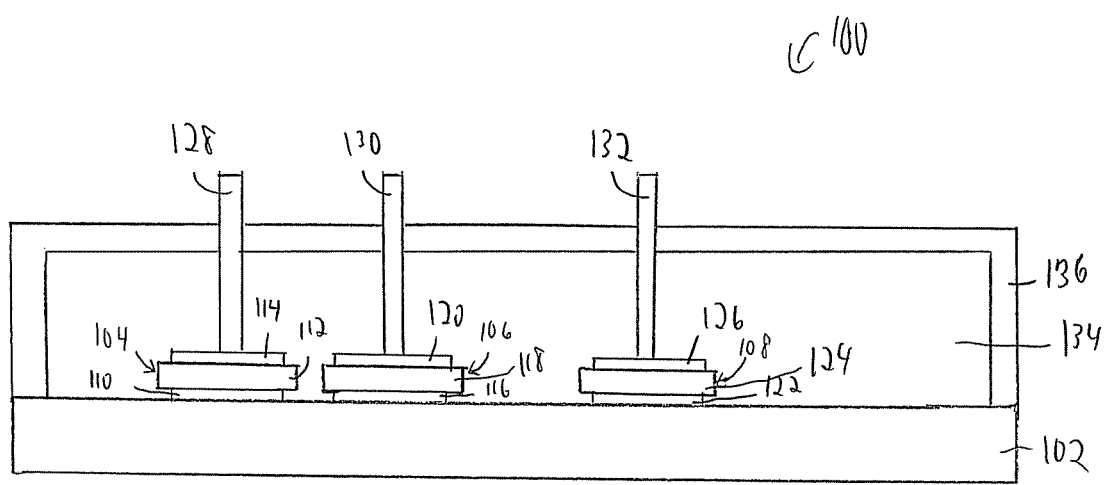
FIG. 1 illustrates a cross-sectional view of one embodiment of a power module.

FIG. 1 illustrates a cross-sectional view of one embodiment of a power module 100. Power module 100 includes a metal baseplate 102, a first control substrate 104, a second control substrate 106, a third control substrate 108, a first control terminal 128, a second control terminal 130, a third control terminal 132, potting material 134, and a housing 136. Power module 100 also includes two insulated gate bipolar transistor (IGBT) substrates electrically coupled in parallel and two diode substrates electrically coupled in parallel (not shown). Power module 100 is a chopper module that excludes the conventional printed circuit board for providing electrical connections.

Baseplate 102 is made of copper or another suitable material. Housing 136 is coupled to baseplate 102. Housing 136 is made of technical plastics or another suitable material. Housing 136 encloses first control substrate 104, second control substrate 106, third control substrate 108, the two IGBT substrates, and the two diode substrates. Potting material 134 fills the areas within housing 136 around first control substrate 104, second control substrate 106, third control substrate 108, the two IGBT substrates, the two diode substrates, first control terminal 128, second control terminal 130, and third control terminal 132.

In one embodiment, first control substrate 104, second control substrate 106, and third control substrate 108 are substantially identical. First control substrate 104 includes a first metal layer 110, a ceramic layer 112, and a second metal layer 114. First metal layer 110 is mounted on baseplate 102 via soldering, sintering, or other suitable process. Second metal layer 114 provides an auxiliary collector control signal pad for power module 100. Second metal layer 114 is electrically coupled to first control terminal 128. First control terminal 128 extends through housing 136 to provide an external electrical connection to the auxiliary collector control signal pad. The auxiliary collector control signal pad is electrically coupled to the two IGBT substrates.

Second control substrate 106 includes a first metal layer 116, a ceramic layer 118, and a second metal layer 120. First metal layer 116 is mounted on baseplate 102 via soldering, sintering, or other suitable process. Second metal layer 120 provides an auxiliary emitter control signal pad for power module 100. Second metal layer 120 is electrically coupled to second control terminal 130. Second control terminal 130 extends through housing 136 to provide an external electrical connection to the auxiliary emitter control signal pad. The auxiliary emitter control signal pad is electrically coupled to the two IGBT substrates via the two diode substrates.

Third control substrate 108 includes a first metal layer 122, a ceramic layer 124, and a second metal layer 126. First metal layer 122 is mounted on baseplate 102 via soldering, sintering, or other suitable process. Second metal layer 126 provides a gate control signal pad for power module 100. Second metal layer 126 is electrically coupled to third control terminal 132. Third control terminal 132 extends through housing 136 to provide an external electrical connection to the gate control signal pad. The gate control signal pad is electrically coupled to the two IGBT substrates via one of the two diode substrates.

Figure 2:
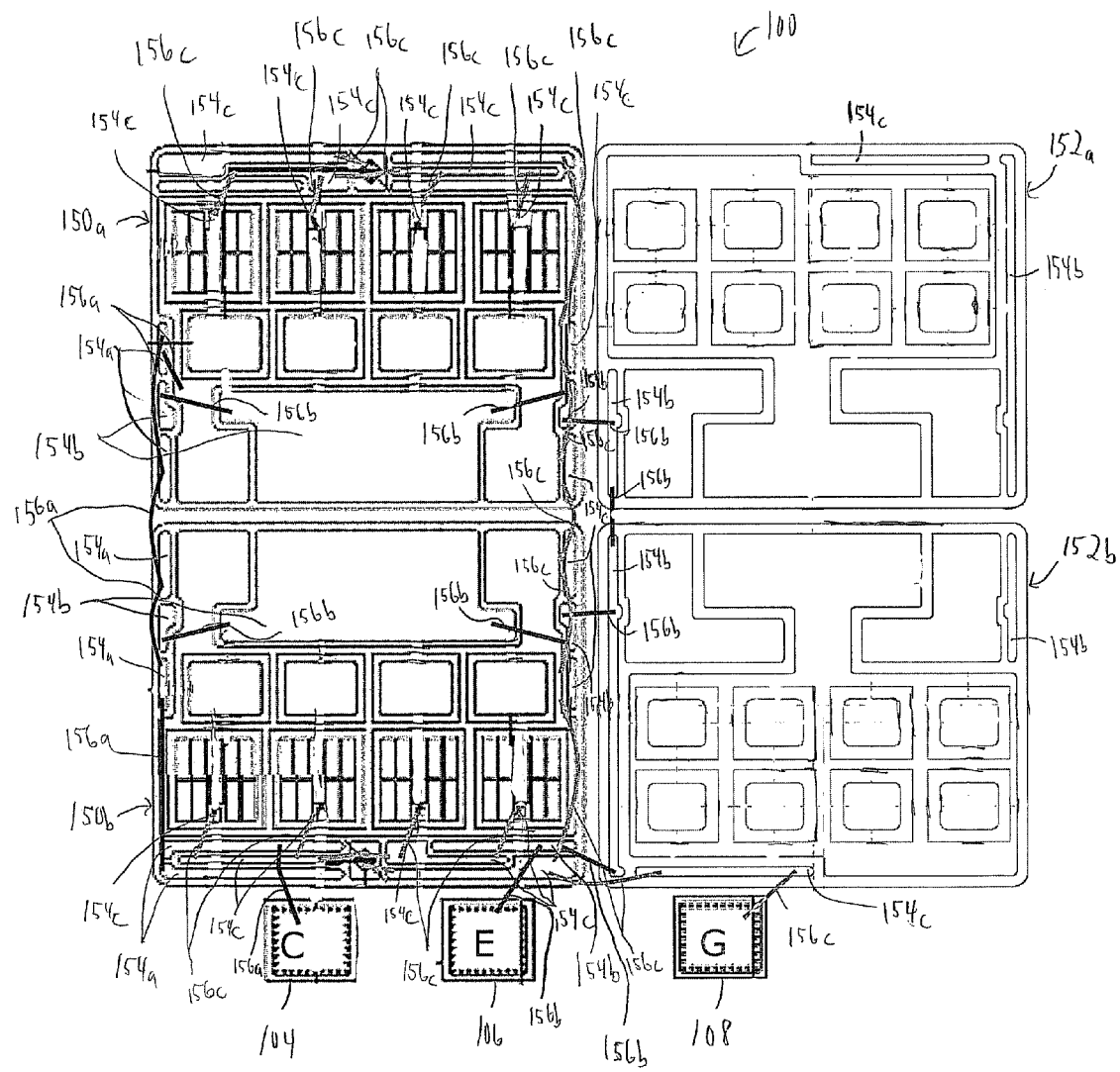
FIG. 2 illustrates a top view of one embodiment of substrates of a power module.

FIG. 2 illustrates a top view of one embodiment of the substrates of power module 100 previously described and illustrated with reference to FIG. 1. Power module 100 includes first control substrate 104, second control substrate 106, third control substrate 108, a first IGBT substrate 150a, a second IGBT substrate 150b, a first diode substrate 152a, and a second diode substrate 152b. First IGBT substrate 150a and second IGBT substrate 150b provide an IGBT leg of a chopper module. First diode substrate 152a and second diode substrate 152b provide a diode leg of the chopper module.

First IGBT substrate 150a is substantially identical to second IGBT substrate 150b, and first diode substrate 152a is substantially identical to second IGBT substrate 152b. Each of the first IGBT substrate 150a and second IGBT substrate 150b includes auxiliary collector control signal pads 154a. The auxiliary collector control signal pads 154a are all electrically coupled together and to first control substrate 104 via bond wires 156a. First diode substrate 152a and second diode substrate 152b do not include any auxiliary collector control signal pads 154a such that auxiliary collector control signals are not routed through first diode substrate 152a or second diode substrate 152b.

Each of the first IGBT substrate 150a, second IGBT substrate 150b, first diode substrate 152a, and second diode substrate 152b includes auxiliary emitter control signal pads 154b. The auxiliary emitter control signal pads 154b are electrically coupled together (except for unused auxiliary emitter control signal pads 154b described below) and to second control substrate 106 via bond wires 156b.

First diode substrate 152a and second diode substrate 152b both include used and unused auxiliary emitter control signal pads 154b. As illustrated in FIG. 2, the auxiliary emitter control signal pads 154b on the left side of first diode substrate 152a and second diode substrate 152b are used while the auxiliary emitter control signal pads 154b on the right side of first diode substrate 152a and second diode substrate 152b are not used. The auxiliary emitter control signal pads 154b are provided on both the left and right sides of each of first diode substrate 152a and second diode substrate 152b so that the two diode substrates can be substantially identical but have different orientations when mounted on the baseplate.

Therefore, first IGBT substrate 150a and second IGBT substrate 150b are electrically coupled to second control substrate 106 via first diode substrate 152a and second diode substrate 152b. The auxiliary emitter control signal pads 154b provided on first diode substrate 152a and second diode substrate 152b have no other purpose than to electrically couple first IGBT substrate 150a and second IGBT substrate 150b to second control substrate 106.

Each of the first IGBT substrate 150a, second IGBT substrate 150b, first diode substrate 152a, and second diode substrate 152b includes gate control signal pads 154c. The gate control signal pads 154c are electrically coupled together (except for unused gate control signal pad 154c described below) and to third control substrate 108 via bond wires 156c. First diode substrate 152a includes an unused gate control signal pad 154c, and second diode substrate 152b includes a used gate control signal pad 154c. The gate control signal pads 154c are provided on both the first diode substrate 152a and second diode substrate 152b so that the two diode substrates can be substantially identical.

Therefore, first IGBT substrate 150a and second IGBT substrate 150b are electrically coupled to third control substrate 108 via second diode substrate 152b. The gate control signal pads 154c provided on first diode substrate 152a and second diode substrate 152b have no other purpose than to electrically couple first IGBT substrate 150a and second IGBT substrate 150b to third control substrate 108.

Figure 3A:
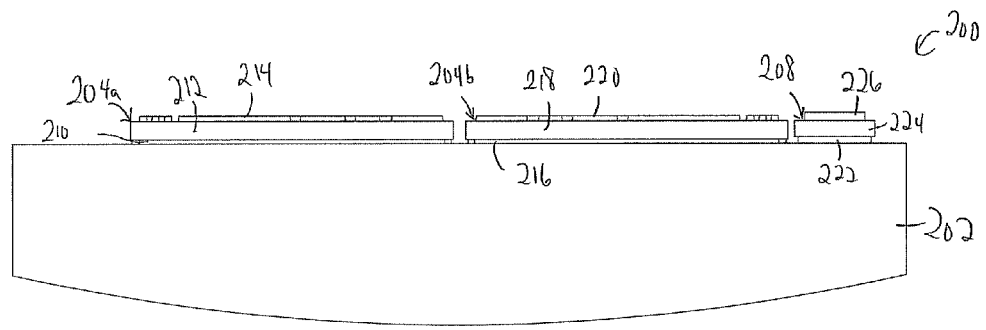
FIG. 3A illustrates a cross-sectional view of another embodiment of a power module.
Figure 3B:
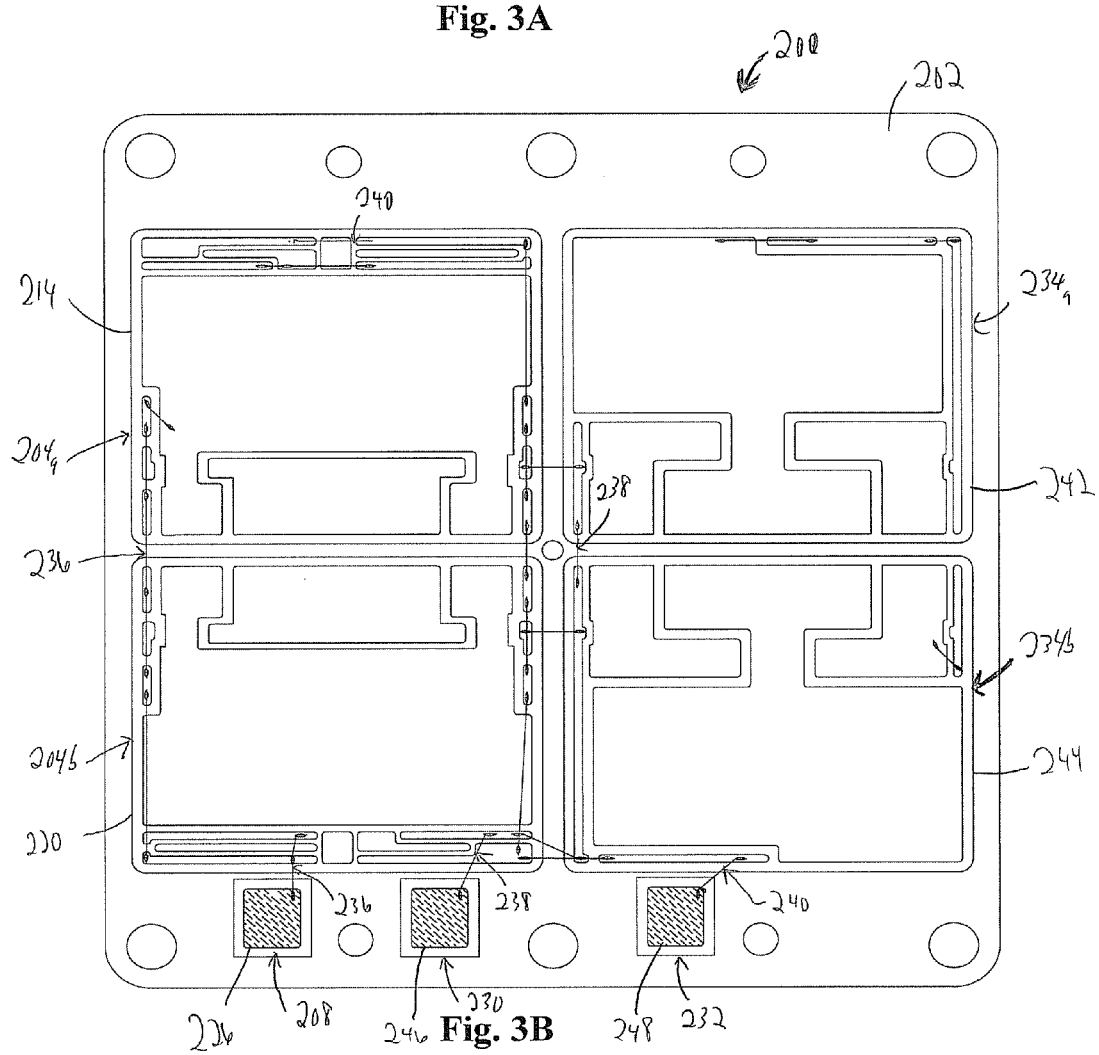
FIG. 3B illustrates a top view of one embodiment of a power module.

FIG. 3A illustrates a cross-sectional view of another embodiment of a power module 200 and FIG. 3B illustrates a top view of one embodiment of power module 200. Power module 200 is a chopper module. Power module 200 includes a metal baseplate 202, a first IGBT substrate 204a, a second IGBT substrate 204b, a first diode substrate 234a, a second diode substrate 234b, a first control substrate 208, a second control substrate 230, and a third control substrate 232. First IGBT substrate 204a and second IGBT substrate 204b provide an IGBT leg of the chopper module. First diode substrate 234a and second diode substrate 234b provide a diode leg of the chopper module.

In one embodiment, baseplate 202 is 130×140 mm. First IGBT substrate 204a includes a metallized ceramic substrate 212. A semiconductor chip 214 including the IGBT is attached to metallized ceramic substrate 212. The metallized ceramic substrate 212 is attached to baseplate 202 via a solder layer or sintered layer 210. Second IGBT substrate 204b includes a metallized ceramic substrate 218. A semiconductor chip 220 including the IGBT is attached to metallized ceramic substrate 218. The metallized ceramic substrate 218 is attached to baseplate 202 via a solder layer or sintered layer 216. First IGBT substrate 204a and second IGBT substrate 204b are attached to baseplate 202 in an aligned mirror symmetrical arrangement.

First diode substrate 234a includes a metallized ceramic substrate (not shown). A semiconductor chip 242 including the diode is attached to the metallized ceramic substrate. The metallized ceramic substrate is attached to baseplate 202 via a solder layer or sintered layer. Second diode substrate 234b includes a metallized ceramic substrate (not shown). A semiconductor chip 244 including the diode is attached to the metallized ceramic substrate. The metallized ceramic substrate is attached to baseplate 202 via a solder layer or sintered layer. First diode substrate 234a and second diode substrate 234b are attached to baseplate 202 in an aligned mirror symmetrical arrangement. In addition, first diode substrate 234a is attached to baseplate 202 such that first diode substrate 234a is aligned with first IGBT substrate 204a. Likewise, second diode substrate 234b is attached to baseplate 202 such that second diode substrate 234b is aligned with second IGBT substrate 204b.

First control substrate 208 includes a metallized ceramic substrate 224. A contact pad 226 is formed on metallized ceramic substrate 224. The metallized ceramic substrate 224 is attached to baseplate 202 via a solder layer or sintered layer 222. Second control substrate 230 includes a metallized ceramic substrate. A contact pad 246 is formed on the metallized ceramic substrate. The metallized ceramic substrate is attached to baseplate 202 via a solder layer or sintered layer. Third control substrate 232 includes a metallized ceramic substrate. A contact pad 248 is formed on the metallized ceramic substrate. The metallized ceramic substrate is attached to baseplate 202 via a solder layer or sintered layer. First control substrate 208, second control substrate 230, and third control substrate 232 are aligned on baseplate 202. First control substrate 208 and second control substrate 230 are directly adjacent to second IGBT substrate 204b. Third control substrate 232 is directly adjacent to second diode substrate 234b.

In one embodiment, first control substrate 208 provides an auxiliary collector control pad, second control substrate 230 provides an auxiliary emitter control pad, and third control substrate 232 provides a gate control pad for the chopper module. An auxiliary collector control signal line 236 is electrically coupled to first control substrate 208, first IGBT substrate 204a, and second IGBT substrate 204b. An auxiliary emitter control signal line 238 is electrically coupled to second control substrate 230, first IGBT substrate 204a, and second IGBT substrate 204b via first diode substrate 234a and second diode substrate 234b. A gate control signal line 240 is electrically coupled to third control substrate 232, first IGBT substrate 204a, and second IGBT substrate 204b via second diode substrate 234b.

Embodiments provide a chopper module in which control signals for the IGBT leg are routed via additional control pads provided on the diode substrates. The additional control pads provided on the diode substrates are not used in the operation of the diodes. In this way, an additional printed circuit board for routing the control signals can be avoided, which reduces the cost of the chopper module. In addition, the area used for control signals in the IGBT leg can also be reduced, which maximizes the area for semiconductor chips in the IGBT leg.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device comprising:
a baseplate;
a first insulated gate bipolar transistor (IGBT) substrate coupled to the baseplate;
a second IGBT substrate coupled to the baseplate;
a first diode substrate coupled to the baseplate;
a second diode substrate coupled to the baseplate;
a first control substrate coupled to the baseplate;
a second control substrate coupled to the baseplate;
a third control substrate coupled to the baseplate;
first bond wires coupling the first IGBT substrate and the second IGBT substrate to the first control substrate;
second bond wires directly and physically coupling the first IGBT substrate and the second IGBT substrate to the second control substrate via the first diode substrate and the second diode substrate; and
third bond wires directly and physically coupling the first IGBT substrate and the second IGBT substrate to the third control substrate via the second diode substrate.

2. The semiconductor device of claim 1, wherein the first IGBT substrate is identical to the second IGBT substrate.

3. The semiconductor device of claim 1, wherein the first diode substrate is identical to the second diode substrate.

4. The semiconductor device of claim 1, wherein the first control substrate, the second control substrate, and the third control substrate are each identical to each other.

5. The semiconductor device of claim 1, wherein the first control substrate provides an auxiliary collector control pad, wherein the second control substrate provides an auxiliary emitter control pad, and
wherein the third control substrate provides a gate control pad.

6. The semiconductor device of claim 1, wherein the first diode substrate and the second diode substrate each comprise used and unused control pads, the used control pads configured for electrically coupling the first IGBT substrate and the second IGBT substrate to the second control substrate and to the third control substrate.

7. The semiconductor device of claim 1, further comprising:
a housing coupled to the baseplate; and
control terminals extending through the housing and coupled to the first control substrate, the second control substrate, and the third control substrate.

8. The semiconductor device of claim 1, wherein each of the first IGBT substrate, the second IGBT substrate, the first diode substrate, the second diode substrate, the first control substrate, the second control substrate, and the third control substrate comprises a metallized ceramic substrate.

9. A chopper module comprising:
a first control substrate;
a second control substrate;
a third control substrate;
an insulated gate bipolar transistor (IGBT) leg coupled to the first control substrate; and
a diode leg comprising signal pads, the signal pads configured to directly and physically couple the IGBT leg to the second control substrate and to the third control substrate via the diode leg.

10. The chopper module of claim 9, wherein the IGBT leg comprises a first IGBT substrate and a second IGBT substrate, and
wherein the signal pads of the diode leg are configured to couple the first IGBT substrate to the second IGBT substrate via the diode leg.

11. The chopper module of claim 9, wherein the IGBT leg is aligned with the diode leg, and
wherein the first control substrate, the second control substrate, and the third control substrate are each aligned with each other.

12. The chopper module of claim 9, wherein the first control substrate and the second control substrate are directly adjacent to the IGBT leg, and
wherein the third control substrate is directly adjacent to the diode leg.

13. The chopper module of claim 9, further comprising:
a baseplate coupled to the first control substrate, the second control substrate, the third control substrate, the IGBT leg, and the diode leg.

14. The chopper module of claim 13, further comprising:
a housing coupled to the baseplate; and
control terminals extending through the housing and coupled to the first control substrate, the second control substrate, and the third control substrate.

15. The chopper module of claim 9, wherein the IGBT leg comprises a first IGBT substrate and a second IGBT substrate, the first IGBT substrate in a mirror symmetrical arrangement with the second IGBT substrate, and
wherein the diode leg comprises a first diode substrate and a second diode substrate, the first diode substrate in a mirror symmetrical arrangement with the second diode substrate.

16. A semiconductor device comprising:
a baseplate;
a first insulated gate bipolar transistor (IGBT) substrate coupled to the baseplate;
a second IGBT substrate coupled to the baseplate;
a first diode substrate coupled to the baseplate;
a second diode substrate coupled to the baseplate;
a first control substrate coupled to the baseplate;
a second control substrate coupled to the baseplate; and
a third control substrate coupled to the baseplate,
wherein the first diode substrate and the second diode substrate comprise used and unused control pads, the used control pads configured for directly and physically coupling the first IGBT substrate and the second IGBT substrate to the second control substrate and to the third control substrate.

* * * * *